United States Patent [19]

Mutziger

[11] 3,939,405
[45] Feb. 17, 1976

[54] APPARATUS AND METHOD FOR MAKING DECAY RATE MEASUREMENTS
[75] Inventor: John Stefan Mutziger, East Moline, Ill.
[73] Assignee: Deere & Company, Moline, Ill.
[22] Filed: Aug. 19, 1974
[21] Appl. No.: 498,297

[52] U.S. Cl. .......... 324/57 R; 324/57 DE; 324/181; 324/161; 324/185; 324/188
[51] Int. Cl.² ....................................... G01R 27/00
[58] Field of Search ..... 324/57 R, 57 DE, 181, 185, 324/188, 162, 163; 307/263; 328/132

[56] References Cited
UNITED STATES PATENTS

| | | | |
|---|---|---|---|
| 2,623,106 | 12/1952 | Fassberg | 324/188 |
| 3,107,329 | 10/1963 | McSkimin | 324/57 R |
| 3,156,865 | 11/1964 | Lamont | 324/57 R |
| 3,505,598 | 4/1970 | Merrill | 324/181 X |
| 3,519,849 | 7/1970 | Tyler | 307/263 X |
| 3,675,047 | 7/1972 | Vahlstrom et al. | 307/263 |
| 3,718,857 | 2/1973 | Bernard | 324/57 R |
| 3,735,261 | 5/1973 | Vahlstrom et al. | 324/181 |

*Primary Examiner*—Saxfield Chatmon, Jr.

[57] ABSTRACT

An apparatus and method is described for automatically measuring the rate of decay of oscillation in mechanical structures, acoustical enclosures, and electrical circuits which have been suitably excited. The apparatus includes a source of excitation energy being applied by a transducer to one point to produce oscillation in the form of vibrations, sound, or electrical pulsations. To initiate measurement, the excitation is terminated, a dual trace oscilloscope is triggered, a data processing circuit is operationalized, and a reference decay rate signal is generated. A pickup transducer at a second point converts the decaying oscillation into an input signal which the data processing circuit absolute-values and log-converts to provide a decaying data signal for display as a slope on the oscilloscope. The reference decay rate signal is generated from an adjustable reference signal by integration and is displayed as a slope on the oscilloscope. By adjusting the reference signal, the reference decay rate signal slope is adjusted to match the slope of the decaying data signal and then the rate of decay which is the value of the slope is determined directly from the value of the reference signal.

10 Claims, 2 Drawing Figures

APPARATUS AND METHOD FOR MAKING DECAY RATE MEASUREMENTS

BACKGROUND OF THE INVENTION

The present invention relates generally to measuring the response of a system to an applied excitation signal and more specifically to measuring the rate of decay of oscillation in mechanical structures, acoustical enclosures, and electrical circuits. Since the rate of decay generally follows an exponential curve, a composite linear slope display on an oscilloscope may be obtained for a wide dynamic range by log conversion of the exponential decay data.

In the past, decay rate meters have been designed to terminate the excitation energy and to initiate alternate production of the logarithms of the decaying data signal and then of an adjustable reference decay rate signal. The operator then adjusted the reference decay rate signal in an iterative process until its slope on the oscilloscope appeared to coincide with that of the alternatively displayed decaying data signal. The operator then read the decay rate of the adjusted reference decay rate signal from an indicator dial.

Further, previous decay rate meters have been subject to nonlinear inaccuracies in the reference decay rate signals. The signals were generated by logarithmic means from a reference signal subject to intrinsic minor fluctuations which caused the generated reference decay rate signals to vary from the ideal signal.

SUMMARY OF THE INVENTION

It is a general object of the present invention to provide for simultaneous, rather than alternate, presentation of the decaying data signal and the reference decay rate signal.

It is a subsidary object to provide a decay rate meter wherein the electronic reference decay rate signal generation function is achieved using integration to provide greater accuracy than achieved by logarithmic means.

These and other objects will become apparent from the ensuing description and the appended drawings.

DESCRIPTION OF THE PREFERRED EMBODIMENT

Figure 1:
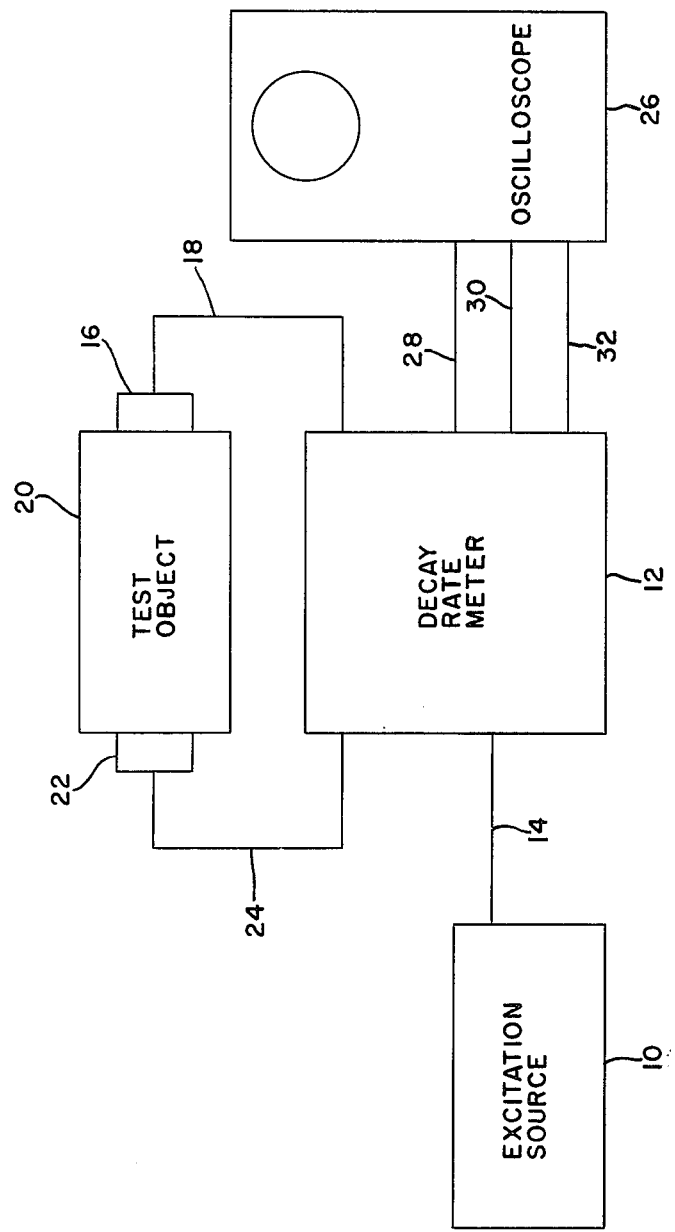
FIG. 1 is a block diagram of a typical test setup for measuring decay rate.

Referring to the drawings, FIG. 1 shows a block diagram of a typical test setup including an excitation source 10 which can be a device for producing any physical phenomena signal including, but not restricted to, a random noise generator, sine wave oscillator, or a stationary signal generator. The source 10 is connected to a decay rate meter 12 by an IN lead 14 and to an exciting transducer 16 by an OUT lead 18. The exciting transducer 16 produces mechanical, acoustical, or electrical excitations from the signals produced by the excitation source 10 so as to excite a test object 20 at one point.

The decay characteristics of the test object 20 are picked up at a second point and are converted into an input data signal by a pickup transducer 22. The input data signal is transmitted to the decay rate meter 12 by a data IN lead 24. The input data signal is processed by the decay rate meter 12 and a decaying data output signal is sent to an indicator means which may be a dual trace oscilloscope 26 through a data OUT lead 28. Within the decay rate meter 12 a reference decay rate signal, hereinafter referred to as the ramp signal, is generated, as will hereinafter be explained, and is transmitted to the oscilloscope 26 by a ramp OUT lead 30. To trigger the oscilloscope 26 to provide simultaneous traces of the decaying data signal and the ramp signal, the decay rate meter 12 and the oscilloscope 26 are connected by a trigger OUT lead 32, as will be hereinafter explained.

Figure 2:
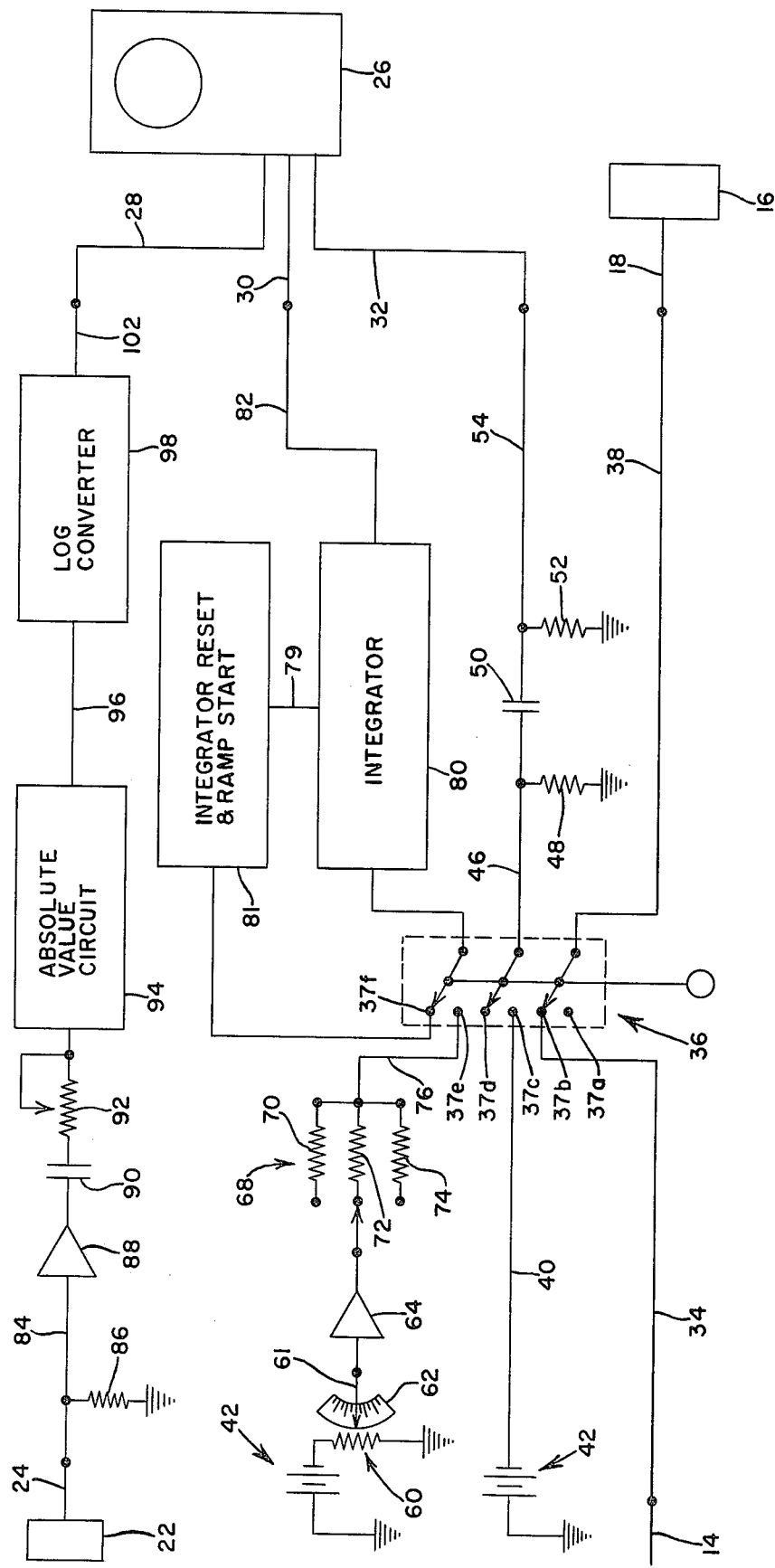
FIG. 2 is a partial schematic and partial block diagram of the data processing, triggering, excitation, and reference decay rate signal generating circuits of this invention.

Illustrated in FIG. 2 is the electrical schematic and block diagram of the decay meter 12 wherein the IN lead 14 is connected to a first excitation lead 34. The first excitation lead 34 is interconnected by a three-pole, two-position excitation switch 36 containing an excite pin 37b and a decay pin 37a with a second excitation lead 38. The second excitation lead 38 in turn is connected to the exciting transducer 16 by the OUT lead 18.

An oscilloscope triggering circuit within the decay rate meter 12 includes a first trigger lead 40 which is connected between a constant potential source 42 and to a trigger pin 37c in the excitation switch 36. The excitation switch 36 interconnects the first trigger lead 40 or an open circuit pin 37d with a second trigger lead 46. The second trigger lead 46 is connected to ground through a resistor 48 and also to a capacitor 50. The capacitor 50 is connected by a third trigger lead 54 to ground through a resistor 52 and to the trigger OUT lead 32.

The decay rate meter 12 also includes a ramp generator circuit to which the constant potential source 42 is applied as a reference signal at a potentiometer 60. A wiper 61 of the potentiometer 60 moves relative to a ramp dial 62 which is calibrated in decibels per second so as to indicate the proportionality between the value of the adjustable reference signal produced by adjusting the potentiometer 60 and the ramp signal produced. The wiper 61 of potentiometer 60 is further connected to a ramp input buffer amplifier 64. The output of the ramp input buffer amplifier 64 is selectively connected by a multiplier range switch 68 with either resistor 70, 72, or 74. The resistors 70, 72, and 74 are connected to a first ramp lead 76 which is connected to a ramp pin 37e in the excitation switch 36. The first ramp lead 76 is interconnected by the excitation switch 36 to an integrator circuit 80 such as commonly known in the art. The excitation switch 36 also interconnects the integrator circuit 80 through a reset pin 37f with an integrator reset and ramp start circuit 81 which is of known circuit configuration. The integrator reset and ramp start circuit 81 is additionally connected by a lead 79 to the integrator circuit 80. The output of the intgrator circuit 80 is connected by a second ramp lead 82 to the ramp OUT lead 30 and thence to the oscilloscope 26.

The decay rate meter 12 further includes a data processing circuit to which the input data signal is transmitted by the pickup transducer 22 and data IN lead 24. The input signal is received by a first data lead 84 which is connected to ground by a resistor 86 and to a data input buffer amplifier 88. The output of data input buffer amplifier 88 is connected to a capacitor 90 which is further connected to a level set variable resistor 92. The data signal from the level set variable resistor 92 is fed into an absolute-value circuit 94 of known circuit configuration which is connected by a second data lead 96 to a log-converter circuit 98 which is also of known circuit configuration. A third data lead 102 connects the log-conveter 98 to the data OUT lead 28 and thence to the oscilloscope 26.

In the description of operation, the effect of the resistors will be ignored, but those skilled in the art will be readily able to determine the appropriate values of the resistances required to provide the desired ranges for optimum operation.

In setting up a test to determine the decay characteristics of a test object 20, the excitation source 10 produces electrical excitation energy which is transmitted through the excitation pin 37b to the exciting transducer 16 which converts the electrical excitation energy into the desired oscillations, for example vibration, sound, or electrical pulses. The test object 20 oscillates in response to the exciting transducer 16, and the effects of the oscillation are detected by the pickup transducer 22 which coverts the oscillation into an electrical input data signal. The input data signal is supplied to the data input buffer amplifier 88 and through to the level set variable resistor 92 which allows adjustment of the input signal to produce data peaks near the optimum voltage for application to the absolute-value circuit 94 which produces an absolute-value data signal. The absolute-value data signal is then supplied to the log-converter circuit 98 which has been internally corrected for zero drift of both the absolute-Value circuit 94 and the log-converter circuit 98 to produce a logarithmic value signal of the instantaneous linear absolute value of the input data signal. The logarithmic value signal which is the decaying data signal is then supplied to the osciloscope 26.

With the excitation switch in the excite position as shown, the integrator reset and ramp start circuit 81 is connected to reset the integrator 80 to the initial value and to position the ramp starting point on the oscilloscope 26 at some value above the value of the expected decaying data signal.

To take a test measurement, the excitation switch 36 is switched from the excite pin 37b to the decay pin 37a which terminates the excitation on the test object. The decay rate of the oscillations generally follows an exponential curve or series of overlapping exponential curves for complex test objects. The decaying data is processed by the pickup transducer 22 to produce the input data signal which is absolute-valued and log-converted to produce a trace of decreasing amplitude versus increasing time having a slope or composite slopes measurable in decibels per second on the oscilloscope 26.

The switching of the excitation switch 36 to the decay pin 37a simultaneously activates the triggering circuit and the ramp generator circuit. In the triggering circuit, this causes a signal to be supplied through the trigger OUT lead 32 to the oscilloscope 26 which triggers a sweep of the trace so that immediate traces of the decaying data and the ramp are formed.

In the ramp generator circuit, the wiper 61 is manipulated to place the potentiometer 60 at the center of its range, and the range multiplier switch 68 has been set on a range setting appropriate to the value of the decaying data signal. When the excitation switch 36 is moved from the excite pin 37f to the decay pin 37e, the reference signal applied to the potentiometer 60 is conducted through the circuit to the integrator circuit 80 where the signal is integrated with respect to time and then supplied to the oscilloscope 26 through the ramp OUT lead 30. On the oscilloscope, the integrated ramp signal appears as a trace in decibels decreasing in amplitude with respect to time and appears simultaneously with the decaying data signal.

The decay rate of the oscillation is found by an iterative process in which the excitation switch 36 is moved repetitively between the excite pin 36a and the decay pin 36b while the wiper 61 and the range multiplier switch 68 are adjusted to produce a ramp trace with a slope in decibels per second equal to the slope of the decaying data signal trace. Once the ramp slope coincides with the decaying data signal slope, the decay rate is then read directly from the ramp dial 62 in decibels per second.

The oscilloscope sweep time can be set for best visual definition because the ramp and decaying data signals are presented simultaneously, and the ramp slope is precisely determined from the calibrated ramp dial 62.

Having thus described the construction and the operation of the preferred embodiment of the invention, various modifications within the spirit and the scope of the invention will become apparent to those skilled in the art and can be made without departing from the underlying principles of the invention as defined in the claims.

I claim:

1. Apparatus for indicating the exponential rate of decay of oscillation in test objects such as mechanical structures, acoustical enclosures, or electrical circuits which have been excited and providing simultaneous indication of an adjustable reference decay rate signal for comparison comprising: means for exciting the test object and terminating the excitation; means for detecting the excitation response and providing a signal proportional thereto; means for receiving and processing the excitation response signal to produce an absolute-valued, log-converted decaying data signal; means for producing a variable, integrated reference decay rate signal simultaneously with the decaying data signal; indicator means for simultaneously presenting the reference decay rate signal and decaying data signal for comparison.

2. Apparatus as claimed in claim 1 including means for simultaneously terminating the excitation, producing the reference decay rate signal, and presenting the reference decay rate signal and the decaying data signal on the indicator means.

3. Apparatus as claimed in claim 1 including range multiplier means proportionately changing the reference signal within a predetermined range so as to provide a wider range of adjustment for the variable reference decay rate signal.

4. Apparatus as claimed in claim 1 wherein the indicator means is dual trace visual recorder with one trace responsive to the decaying data signal and the other trace to the variable reference decay rate signal.

5. Apparatus for indicating the rate of decay of oscillation in test objects such as mechanical structures, acoustical enclosures, and electrical circuits which have been suitably excited and providing simultaneous presentation of an adjustable reference decay rate signal for comparison comprising: a source of excitation energy for exciting a test object with the excitation energy in such forms as acoustical, mechanical, or electrical energy at a first predetermined point; means for terminating the excitation energy; means for detecting the excitation response of the test object at a second predetermined point and providing an input signal representative of the excitation response of the test object; means for receiving the input signal and producing a signal which is the absolute value of the input signal; means for log-converting the absolute-value signal and producing a decaying data signal which is the logarithmic value of the absolute-value signal; means for generating and varying a reference signal within a predetermined amplitude range and providing an indication of the value of the amplitude; means for integrating the reference signal and producing a reference decay rate signal made variable by varying the reference signal; means responsive to the means for terminating the excitation energy for triggering indicator means responsive to the decaying data signal and the reference decay rate signal for producing an indication representative of the decaying data signal from the test object and the variable decay rate for simultaneous comparison.

6. A method of determining the exponential decay rate of a test object which comprises the steps of: exciting the test object at a first selected point; terminating the excitation imposed on the test object; converting the decay response of the test object due to the termination of the excitation into an electrical input signal at a second selected point; absolute valuing of the electrical input signal to obtain an absolute-value electrical signal; log converting the absolute value electrical signal to obtain a decaying data electrical signal which is a logarithmic value of the absolute-value signal; generating an adjustable reference signal upon the termination of the excitation; integrating the adjustable reference signal to produce a variable reference decay rate electrical signal; adjusting the reference signal to produce a reference decay rate electrical signal which coincides with the decaying data electrical signal whereby the decay rate of the test object may be determined from the value of the adjusted reference signal.

7. The method as claimed in claim 6 wherein the terminating of the excitation is done simultaneously with the integrating of the adjustable reference signal.

8. The method of determining the exponential electrical decay rate in a circuit which comprises the steps of: exciting the electrical circuit with an oscillating electrical signal at a first selected point; terminating the electrical signal imposed on the circuit; detecting the electrical decay response signal of the circuit due to the termination of the electrical signal at a second selected point; absolute valuing the electrical decay response signal to obtain an absolute-value electrical signal; log converting the absolute-value electrical signal to obtain a decaying data signal which is a logarithmic value of the absolute-value electrical signal; generating an adjustable reference signal upon the termination of the electrical signal; processing the adjustable reference signal to produce a variable reference decay rate electrical signal; adjusting the adjustable reference signal until the variable reference decay rate electrical signal coincides with the decaying data electrical signal whereby the electrical decay rate characteristics of the circuit may be determined from the value of the adjusted reference signal.

9. The method of determining sound decay rate of an enclosure which comprises the steps of: exciting the enclosure with sound at a first selected point; terminating the excitation sound imposed on the enclosure; converting the sound decay of the enclosure due to the termination of the excitation sound into an electrical input signal at a second selected point; absolute valuing the electrical input signal to obtain an absolute-value electrical signal; log converting the absolute-value electrical signal to obtain a decaying data electrical signal which is a logarithmic value of the absolute-value signal; generating an adjustable reference signal upon the termination of the excitation sound; processing the adjustable reference signal to produce a variable reference decay rate electrical signal; adjusting the reference signal to produce a reference decay rate electrical signal which coincides with the decaying data electrical signal whereby the decay rate characteristics of the enclosure may be determined from the value of the adjusted reference signal.

10. The method of determining the exponential vibration decay rate of a structure which comprises the steps of: exciting the structure with vibration at a first selected point; terminating the excitation vibration imposed on the structure; converting the vibration decay of the structure due to the termination of the excitation vibration into an electrical input signal at a second selected point; absolute valuing the electrical input signal to obtain an absolute-value electrical signal; log converting the absolute-value electrical signal to obtain a decaying electrical signal which is a logarithmic valve of the absolute value signal; generating an adjustable reference signal upon the termination of the exciting vibration; processing the adjustable reference signal to produce a variable reference decay rate electrical signal; adjusting the reference signal to produce a reference decay rate electrical signal which coincides with the decaying data electrical signal whereby the vibration decay rate of the structure may be determined from the value of the adjusted reference signal.

* * * * *